(12) United States Patent
Falster

(10) Patent No.: US 6,336,968 B1
(45) Date of Patent: *Jan. 8, 2002

(54) NON-OXYGEN PRECIPITATING CZOCHRALSKI SILICON WAFERS

(75) Inventor: Robert J. Falster, Milan (IT)

(73) Assignee: MEMC Electronic Materials, Inc., St. Peters, MO (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 48 days.

(21) Appl. No.: 09/379,383

(22) Filed: Aug. 23, 1999

Related U.S. Application Data

(60) Provisional application No. 60/098,822, filed on Sep. 2, 1998.

(51) Int. Cl.$^7$ .............................................. C30B 33/02
(52) U.S. Cl. .............................................. 117/2; 117/3
(58) Field of Search ......................................... 117/2, 3

(56) References Cited

U.S. PATENT DOCUMENTS

| | | | |
|---|---|---|---|
| 4,314,595 A | 2/1982 | Yamamoto et al. | 148/1.5 |
| 4,376,657 A | 3/1983 | Nagasawa et al. | 148/1.5 |
| 4,437,922 A | 3/1984 | Bischoff et al. | 156/603 |
| 4,505,759 A | 3/1985 | O'Mara | 148/1.5 |
| 4,548,654 A | 10/1985 | Tobin | 148/1.5 |
| 4,851,358 A | 7/1989 | Huber | 437/10 |
| 4,868,133 A | 9/1989 | Huber | 437/10 |
| 5,327,007 A | 7/1994 | Imura et al. | 257/610 |
| 5,401,669 A | 3/1995 | Falster et al. | 437/12 |
| 5,403,406 A | 4/1995 | Falster et al. | 148/33.2 |
| 5,445,975 A | 8/1995 | Gardner et al. | 437/10 |
| 5,478,408 A | 12/1995 | Mitani et al. | 448/33.3 |
| 5,502,010 A | 3/1996 | Nadahara et al. | 437/247 |
| 5,502,331 A | * 3/1996 | Inoue et al. | 257/617 |
| 5,534,294 A | 7/1996 | Kubota et al. | 427/255 |
| 5,539,245 A | 7/1996 | Imura et al. | 257/610 |
| 5,593,494 A | 1/1997 | Falster | 117/2 |
| 5,611,855 A | 3/1997 | Wijaranakula | 117/2 |
| 5,674,756 A | 10/1997 | Satoh et al. | 437/10 |
| 5,738,942 A | 4/1998 | Kubota et al. | 428/428 |
| 5,788,763 A | 8/1998 | Hayashi et al. | 117/593 |
| 5,939,770 A | 8/1999 | Kageyama | 257/611 |
| 5,944,889 A | 8/1999 | Park et al. | 117/94 |
| 5,954,873 A | 9/1999 | Hourai et al. | 117/13 |
| 5,994,761 A | * 11/1999 | Falster et al. | 257/611 |

FOREIGN PATENT DOCUMENTS

| | | | |
|---|---|---|---|
| DE | 43 23 964 A1 | 1/1994 | H01L/21/324 |
| EP | 0503816 | 9/1992 | C30B/33/02 |
| EP | 0 536 958 A1 | 4/1993 | C30B/15/00 |
| EP | 0 716 168 A1 | 6/1996 | C30B/15/14 |
| EP | 0915502 | 5/1999 | H01L/21/322 |
| JP | 3-9078 | 2/1991 | C30B/29/06 |
| JP | 5-155700 A | 6/1993 | C30B/33/02 |
| JP | 7-201874 A | 8/1995 | H01L/21/322 |
| JP | Hei 7/321120 | 12/1995 | |
| JP | Hei 7/335657 | 12/1995 | |
| JP | Hei 8/045944 | 2/1996 | |
| JP | Hei 8/045945 | 2/1996 | |
| JP | Hei 8/045947 | 2/1996 | |
| JP | Hei 9-199416 | 7/1997 | H01L/21/20 |
| JP | 11-067781 | 3/1999 | H01L/21/322 |
| JP | 11-150119 | 6/1999 | H01L/21/322 |
| WO | WO 98/38675 | 9/1998 | H01L/21/322 |
| WO | WO 98/45507 | 10/1998 | C30B/15/00 |

OTHER PUBLICATIONS

Hawkins, et al., The Effect of Rapid Thermal Annealing on the Precipitation of Oxygen in Silicon, J. Appl. Phys., 65 (9), May 1, 1989, pp. 3644–3654.*

Wolf et al., Silicon Processing for the VLSI Era, vol. 1: Process Technology, Lattice Press, Sunset Beach, CA, USA, pp. 56–70, 1986.*

T. Abe, et al. "Defect–Free Surfaces of Bulk Wafers by Combination of RTA and Crystal Growth Conditions" (publication information unknown).

T. Abe, "Innovated Silicon Crystal Growth and Wafering Technologies" Electrochemical Society Proceedings, vol. 97, No. 3, pp. 123–133.

A. Hara et al. "Enhancement of Oxygen Precipitation in Quenched Czochralski Silicon Crystals" J. Appl. Phys., vol. 66, No. 8(1989), pp. 3958–3960.

F. Shimura "Semiconductor Silicon Crystal Technology" Academic Press, Inc., San Diego, CA (1989), pp. 361–367.

R. Winkler et al. "Improvement of the Gate Oxide Integrity by Modifying Crystal Pulling and Its Impact on Device Failures" Journal of the Electrochemical Society, vol. 141, No. 5 (1994), pp. 1398–1401.

H. Zimmerman et al. "Vacancy Concentration Wafer mapping in Silicon" Journal of Crystal Growth, vol. 129 (1993), pp. 582–592.

(List continued on next page.)

Primary Examiner—Robert Kunemund
Assistant Examiner—Matthew Anderson
(74) Attorney, Agent, or Firm—Senniger, Powers, Leavitt & Roedel

(57) ABSTRACT

The present invention relates to a process for the treatment of Czochralski single crystal silicon wafers to dissolve existing oxygen clusters and precipitates, while preventing their formation upon a subsequent oxygen precipitation heat treatment. The process comprises (i) heat-treating the wafer in a rapid thermal annealer at a temperature of at least 1150° C. in an atmosphere having an oxygen concentration of at least 1000 ppma, or alternatively (ii) heat-treating the wafer in a rapid thermal annealer at a temperature of at least about 1150° C. and then controlling the rate of cooling from the maximum temperature achieved during the heat-treatment through a temperature range in which vacancies are relatively mobile in order to reduce the number density of vacancies in the single crystal silicon to a value such that oxygen precipitates will not form if the wafer is subsequently subjected to an oxygen precipitation heat-treatment.

44 Claims, No Drawings

OTHER PUBLICATIONS

Herng–Der Chiou, "The Effects of Preheatings on Axial Oxygen Precipitation Uniformity in Czochralski Silicon Crystals", J. Electrochem. Soc., vol. 139, No. 6, Jun., 1992.

Nadahara, et al., "Hydrogen Annealed Silicon Wafer", Solid State Phenomena, vols. 57–58, pp. 19–26 (1997).

Falster, R., et al., "The Engineering of Silicon Wafer Material Properties Through Vacancy Concentration Profile Control and the Achievement of Ideal Oxygen Precipitation Behavior", Mat. Res. Soc. Symp. Proc., vol. 510, pp. 27–35, 1998.

Jacob, M., et al., "Influence of RTP on Vacancy Concentrations", Mat. Res. Soc. Symp. Proc. vol. 490, pp. 129–134.

Pagani, M., et al., "Spatial variations in oxygen precipitation in silicon after high temperature rapid thermal annealing", Appl. Phys. Lett., vol. 70, No. 12, pp. 1572–1574, 1997.

Hawkins, et al., "Effect of Rapid Thermal Processing on Oxygen Precipitation in Silicon", Mat. Res. Soc. Symp. Proc., vol. 104, pp. 197–200, 1988.

Hawkins, et al., "The Effect of Rapid Thermal Annealing on the Precipitation of Oxygen in Silicon", J. Appl. Phys., vol. 65, No. 9, pp. 3644–3654, 1989.

International Search Report for Application No. PCT/US 99/19301 dated Aug. 25, 1999, 10 pages.

* cited by examiner

NON-OXYGEN PRECIPITATING CZOCHRALSKI SILICON WAFERS

REFERENCE TO RELATED APPLICATION

This application claims priority from U.S. provisional application Ser. No. 60/098,822, filed on Sep. 2, 1998.

BACKGROUND OF THE INVENTION

The present invention generally relates to the preparation of semiconductor material substrates, especially silicon wafers, which are used in the manufacture of electronic components. More particularly, the present invention relates to a process for the treatment of Czochralski single crystal silicon wafers to dissolve existing oxygen clusters and precipitates, while preventing their formation upon a subsequent oxygen precipitation heat treatment.

Single crystal silicon, which is the starting material for most processes for the fabrication of semiconductor electronic components, is commonly prepared with the so-called Czoclualski process wherein a single seed crystal is immersed into molten silicon and then grown by slow extraction. As molten silicon is contained in a quartz crucible, it is contaminated with various impurities, among which is mainly oxygen. At the temperature of the silicon molten mass, oxygen comes into the crystal lattice until it reaches a concentration determined by the solubility of oxygen in silicon at the temperature of the molten mass and by the actual segregation coefficient of oxygen in solidified silicon. Such concentrations are greater than the solubility of oxygen in solid silicon at the temperatures typical for the processes for the fabrication of electronic devices. As the crystal grows from the molten mass and cools, therefore, the solubility of oxygen in it decreases rapidly, whereby in the resulting slices or wafers oxygen is present in supersaturated concentrations.

During the thermal treatment cycles typically employed in the fabrication of electronic devices, oxygen precipitate nucleation centers may form and ultimately grown into large oxygen clusters or precipitates. The presence of such precipitates in the active device region of the wafer can impair the operation of the device. Historically, to address this problem electronic device fabrication processes included a series of steps which were designed to produce silicon having a zone or region near the surface of the wafer which is free of oxygen precipitates (commonly referred to as a "denuded zone" or a "precipitate free zone"). Denuded zones can be formed, for example, in a high-low-high thermal sequence such as (a) oxygen out-diffusion heat treatment at a high temperature (>1100° C.) in an inert ambient for a period of at least about 4 hours, (b) oxygen precipitate nuclei formation at a low temperature (600–750° C.), and (c) growth of oxygen ($SiO_2$) precipitates at a high temperature (1000–1150° C.). See, e.g., F. Shimura, *Semiconductor Silicon Crystal Technology*, Academic Press, Inc., San Diego Calif.(1989) at pages 361–367 and the references cited therein.

More recently, however, advanced electronic device manufacturing processes such as DRAM manufacturing processes have begun to minimize the use of high temperature process steps. Although some of these processes retain enough of the high temperature process steps to produce a denuded zone, the tolerances on the material are too tight to render it a commercially viable product. Other current, highly advanced electronic device manufacturing processes contain no out-diffusion steps at all. Because of the problems associated with oxygen precipitates in the active device region, therefore, these electronic device fabricators must use silicon wafers which are incapable of forming oxygen precipitates anywhere in the wafer under their process conditions.

Accordingly, a process is needed by which existing oxygen clusters or precipitates in the silicon wafer may be dissolved, prior to the device fabrication, in such a way that future formation of oxygen precipitates within the wafer is prevented.

SUMMARY OF THE INVENTION

Among the objects of the invention, therefore, is the provision of a Czochralski single crystal silicon wafer, as well as the process for the preparation thereof, in which oxygen clusters and precipitates have been dissolved; and, the provision of such a wafer which will not form oxygen precipitates or clusters upon being subjected to an oxygen precipitation heat treatment.

Briefly, therefore, the present invention is directed to a process for heat-treating a Czochralski single crystal silicon wafer in a rapid thermal annealer to dissolve oxygen clusters, and to prevent future precipitate formation resulting from a subsequent thermal processing step. The process comprises heat-treating the wafer at a temperature of at least about 1150° C. in an atmosphere having an oxygen concentration of at least about 1000 ppma to dissolve existing oxygen clusters and yield a wafer which is incapable of forming oxygen precipitates upon being subjected to an oxygen precipitation heat treatment.

The present invention is further directed to a process for heat-treating a Czochralgki single crystal silicon wafer to dissolve oxygen precipitates or clusters, and to prevent future precipitate formation resulting from a subsequent thermal processing step. The process comprises heat-treating the wafer in a rapid thermal annealer at a temperature of at least about 1150° C. to dissolve existing oxygen clusters or precipitates, and controlling the cooling rate of the heat-treated wafer down to a temperature of less than about 950° C. to produce a wafer which is incapable of forming oxygen precipitates upon being subjected to an oxygen precipitation heat treatment.

The present invention is still further directed to a process for heat-treating a Czochralski single crystal silicon wafer to dissolve oxygen precipitates or clusters, and to prevent future precipitate formation resulting from a subsequent thermal processing step. The process comprises heat-treating the wafer in a rapid thermal annealer at a temperature of at least about 1150° C. in an atmosphere to dissolve existing oxygen clusters or precipitates. The heat-treated wafer is then cooled to a temperature between about 950 and 1150° C. at a rate in excess of about 20° C., and then thermally annealed at a temperature between about 950and 1150° C. to produce a wafer which is incapable of forming oxygen precipitates upon being subjected to an oxygen precipitation heat treatment.

Other objects and features of this invention will be in part apparent and in part pointed out hereinafter.

DETAILED DESCRIPTION OF THE PREFERRED EMBODIMENTS

The process of the present invention affords the means by which to obtain a single crystal silicon wafer having a reduced concentration of oxygen precipitates or clusters, as well as other defects to which these precipitates are related. Additionally, the present process yields a wafer which, during essentially any subsequent oxygen precipitation heat treatment (e.g., annealing the wafer at a temperature of 800° C. for four hours and then at a temperature of 1000° C. for sixteen hours), will not form oxygen precipitates. The process of the present invention therefore acts to annihilate or dissolve a variety of pre-existing defects such as large oxygen clusters and certain kinds of oxygen induced stacking fault ("OISF") nuclei throughout the wafer. The dissolved oxygen which remains in the wafer will not precipitate, even if the wafer is subjected to an oxygen precipitation heat treatment.

The starting material for the process of the present invention is a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, New York, 1982 (incorporated herein by reference). The silicon wafer may be polished or, alternatively, it may be lapped and etched but not polished. In addition, the wafer may have vacancy or self-interstitial point defects as the predominant intrinsic point defect. For example, the wafer may be vacancy dominated from center to edge, self-interstitial dominated from center to edge, or it may contain a central core of vacancy of dominated material surrounded by an axially symmetric ring of self-interstitial dominated material.

Czochralski-grown silicon typically has an oxygen concentration within the range of about $5 \times 10^{17}$ to about $9 \times 10^{17}$ atoms/cm$^3$ (ASTM standard F-121-83). Because the oxygen precipitation behavior of the wafer is essentially erased by the present process (i.e., the wafer is essentially rendered non-oxygen precipitating, even if subjected to an oxygen precipitation heat treatment), the starting wafer may have an oxygen concentration falling anywhere within or even outside the range attainable by the Czochralski process. Depending upon the cooling rate of the single crystal silicon ingot from the temperature of the melting point of silicon (about 1410° C.) through the range of about 750° C. to about 350° C., oxygen precipitate nucleation centers may form in the single crystal silicon ingot from which the wafer is sliced.

The presence or absence of these nucleation centers in the starting material is not critical to the present invention. Preferably, however, these centers are capable of being dissolved by the rapid thermal anneal heat-treatment of the present invention.

In accordance with the process of the present invention, a single crystal silicon wafer is first subjected a heat treatment step in which the wafer is heated to an elevated temperature. Preferably, this heat treatment step is carried out in a rapid thermal annealer in which the wafer is rapidly heated to a target temperature and annealed at that temperature for a relatively short period of time. In general, the wafer is subjected to a temperature in excess of 1150° C., preferably at least 1175° C., more preferably at least about 1200° C., and most preferably between about 1200° C. and 1275° C. The wafer will generally be maintained at this temperature for at least one second, typically for at least several seconds (e.g., at least 3), preferably for several tens of seconds (e.g., 20, 30, 40, or 50 seconds) and, depending upon the pre-existing defects, for a period which may range up to about 60 seconds (which is near the limit for commercially available rapid thermal annealers).

The rapid thermal anneal may be carried out in any of a number of commercially available rapid thermal annealing ("RTA") furnaces in which wafers are individually heated by banks of high power lamps. RTA furnaces are capable of rapidly heating a silicon wafer, e.g., they are capable of heating a wafer from room temperature to 1200° C. in a few seconds. One such commercially available RTA furnace is the model 610 furnace available from AG Associates (Mountain View, Calif.).

Heat-treating the wafer at a temperature in excess of 1150° C. will cause the dissolution of a variety of pre-existing oxygen clusters and OISF nuclei. In addition, it will increase the number density of crystal lattice vacancies in the wafer.

Information obtained to date suggests that certain oxygen-related defects, such as ring oxidation induced stacking faults (OISF), are high temperature nucleated oxygen agglomerates catalyzed by the presence of a high concentration of vacancies. Furthermore, in high vacancy regions, oxygen clustering is believed to occur rapidly at elevated temperatures, as opposed to regions of low vacancy concentration where behavior is more similar to regions in which oxygen precipitate nucleation centers are lacking. Because oxygen precipitation behavior is influenced by vacancy concentration, therefore, the number of density of vacancies in the heat-treated wafer is controlled in the process of the present invention to avoid oxygen precipitation in a subsequent oxygen precipitation heat treatment.

In a first embodiment of the process of the present invention, the vacancy concentration in the heat-treated wafers is controlled, at least in part, by controlling the atmosphere in which the heat-treatment is carried out. Experimental evidence obtained to date suggests that the presence of a significant amount of oxygen suppresses the vacancy concentration in the heat-treated wafer. Without being held to any particular theory, it is believed that the rapid thermal annealing treatment in the presence of oxygen results in the oxidation of the silicon surface and, as a result, acts to create an inward flux of silicon self-interstitials. This inward flux of self-interstitials has the effect of gradually altering the vacancy concentration profile by causing recombinations to occur, beginning at the surface and then moving inward.

Regardless of the mechanism, the rapid thermal annealing step is carried out in the presence of an oxygen-containing atmosphere in the first embodiment of the process of the present invention; that is, the anneal is carried out in an atmosphere containing oxygen gas ($O_2$), water vapor, or an oxygen-containing compound gas which is capable of oxidizing an exposed silicon surface. The atmosphere may thus consist entirely of oxygen or oxygen compound gas, or it may additionally comprise a non-oxidizing gas such as argon. It is to be noted, however, that when the atmosphere is not entirely oxygen, preferably the atmosphere will contain a partial pressure of oxygen of at least about 0.001 atmospheres (atm.), or 1,000 parts per million atomic (ppma). More preferably, the partial pressure of oxygen in the atmosphere will be at least about 0.002 atm. (2,000 ppma), still more preferably 0.005 atm. (5,000 ppma), and still more preferably 0.01 atm. (10,000 ppma).

Intrinsic point defects (vacancies and silicon self-interstitials) are capable of diffusing through single crystal silicon with the rate of diffusion being temperature dependant. The concentration profile of intrinsic point defects, therefore, is a function of the diffusivity of the intrinsic point defects and the recombination rate as a function of temperature. For example, the intrinsic point defects are relatively mobile at temperatures in the vicinity of the temperature at which the wafer is annealed in the rapid thermal annealing step, whereas they are essentially immobile for any commercially practical time period at temperatures of as much as 700° C. Experimental evidence obtained to-date suggests that the effective diffusion rate of vacancies slows considerably at temperatures less than about 700° C. and perhaps as great as 800° C., 900° C., or even 1,000° C., the vacancies can be considered to be immobile for any commercially practical time period.

In a second embodiment of the present invention, therefore, the concentration of vacancies in the heat-treated wafer is controlled, at least in part, by controlling the cooling rate of the wafer through the temperature range at which vacancies are relatively mobile. As the temperature of the wafer is decreased through this range of temperatures, the vacancies diffuse to the wafer surface and are annihilated, thus leading to a change in the vacancy concentration profile with the extent of change depending upon the length of time the wafer is maintained at a temperature within this range and the magnitude of the temperature; in general, greater temperatures and longer diffusion times lead to increased diffusion. In general, the average cooling rate from the annealing temperature to the temperature at which vacancies are practically immobile (e.g., about 950° C.) is preferably no more than 20° C. per second, more preferably no more than about 10° C., and still more preferably no more than about 5° C. per second.

Alternatively, the temperature of the wafer following the high temperature anneal may be reduced quickly (e.g., at a rate greater than about 20° C./second) to a temperature of less than about 1150° C. but greater than about 950° C. and held for a time which is dependent upon the holding temperature. For example, for temperatures near 1150° C., several seconds (e.g., at least about 2, 3, 4, 6 or more) may be sufficient whereas at temperatures near 950° C. several minutes (e.g., at least about 2, 3, 4, 6 or more) may be required to sufficiently reduce the vacancy concentration.

Once the wafer is cooled to a temperature outside the range of temperatures at which crystal lattice vacancies are relatively mobile in the single crystal silicon, the cooling rate does not appear to significantly influence the precipitating characteristics of the wafer and thus, does not appear to be narrowly critical.

Conveniently, the cooling step may be carried out in the same atmosphere in which the heating step is carried out. Suitable atmospheres include, for example, nitriding atmospheres (that is, atmospheres containing nitrogen gas ($N_2$) or a nitrogen-containing compound gas, such as ammonia, which is capable of nitriding an exposed silicon surface); oxidizing (oxygen-containing) atmospheres; non-oxidizing, non-nitriding atmospheres (such as argon, helium, neon, carbon dioxide), and combinations thereof.

While the rapid thermal treatments employed in this process may result in the out-diffusion of a small amount of oxygen from the surface of the front and back surfaces of the wafer, the resulting heat-treated wafer has a substantially uniform interstitial oxygen concentration as a function of distance from the silicon surface. For example, a heat-treated wafer will have a substantially uniform concentration of interstitial oxygen from the center of the wafer to regions of the wafer which are within about 15 microns of the silicon surface, more preferably from the center of the silicon to regions of the wafer which are within about 10 microns of the silicon surface, even more preferably from the center of the silicon to regions of the wafer which are within about 5 microns of the silicon surface, and most preferably from the center of the silicon to regions of the wafer which are within about 3 microns of the silicon surface. In this context, a substantially uniform oxygen concentration shall mean a variance in the oxygen concentration of no more than about 50%, preferably no more than about 20%, and most preferably no more than about 10%.

In view of the above, it will be seen that the several objects of the invention are achieved. As various changes could be made in the above compositions and processes without departing from the scope of the invention, it is intended that all matter contained in the above description be interpreted as illustrative and not in a limiting sense.

What is claimed is:

1. A process for heat-treating a Czochralski single crystal silicon wafer to dissolve pre-existing oxygen precipitates, the process comprising heat-treating the wafer in a rapid thermal annealer at a temperature of at least about 1150° C. in an atmosphere having an oxygen concentration of at least about 1000 ppma to control the crystal lattice vacancy concentration to prevent the formation of oxygen precipitates in a subsequent oxygen precipitation heat treatment.

2. The process of claim 1 wherein the atmosphere has an oxygen concentration of at least about 2000 ppma.

3. The process of claim 1 wherein the atmosphere has an oxygen concentration of at least about 5000 ppma.

4. The process of claim 1 wherein the atmosphere has an oxygen concentration of at least about 10,000 ppma.

5. The process of claim 1 wherein the wafer is heat-treated for at least about 20 seconds.

6. The process of claim 1 wherein the wafer is heat-treated for at least about 40 seconds.

7. The process of claim 1 wherein the wafer is heat-treated at a temperature of at least about 1175° C.

8. The process of claim 7 wherein the atmosphere has an oxygen concentration of at least about 2000 ppma.

9. The process of claim 7 wherein the atmosphere has an oxygen concentration of at least about 5000 ppma.

10. The process of claim 7 wherein the atmosphere has an oxygen concentration of at least about 10,000 ppma.

11. The process of claim 7 wherein the wafer is heat-treated for at least about 20 seconds.

12. The process of claim 7 wherein the wafer is heat-treated for at least about 40 seconds.

13. The process of claim 1 wherein the wafer is heat-treated at a temperature between about 1200° C. to about 1275° C.

14. The process of claim 13 wherein the atmosphere has an oxygen concentration of at least about 2000 ppma.

15. The process of claim 13 wherein the atmosphere has an oxygen concentration of at least about 5000 ppma.

16. The process of claim 13 wherein the atmosphere has an oxygen concentration of at least about 10,000 ppma.

17. The process of claim 13 wherein the wafer is heat-treated for at least about 20 seconds.

18. The process of claim 13 wherein the wafer is heat-treated for at least about 40 seconds.

19. A process for heat-treating a Czochralski single crystal silicon wafer to dissolve pre-existing oxygen precipitates, the process comprising heat-treating the wafer in a rapid thermal annealer at a temperature of at least about 1150° C. and controlling the rate of cooling from the maximum temperature achieved during the heat-treatment through a temperature range in which vacancies are relatively mobile for a time period sufficient to reduce the number density of crystal lattice vacancies in the cooled wafer prior to cooling the wafer below the temperature range in which vacancies are relatively mobile, to reduce the number density of vacancies in the single crystal silicon to a value such that oxygen precipitates will not form in the heat-treated wafer upon subjecting the wafer to an oxygen precipitation heat-treatment.

20. The process of claim 19 wherein the cooling rate is less than about 20° C./second.

21. The process of claim 19 wherein the cooling rate is less than about 10° C./second.

22. The process of claim 19 wherein the cooling rate is less than about 5° C./second.

23. The process of claim 19 wherein the wafer is heat-treated at a temperature of at least about 1175° C.

24. The process of claim 23 wherein the cooling rate is less than about 20° C./second.

25. The process of claim 23 wherein the cooling rate is less than about 10° C./second.

26. The process of claim 23 wherein the cooling rate is less than about 5° C./second.

27. The process of claim 19 wherein the wafer is heat-treated at a temperature between about 1200° C. to about 1275° C.

28. The process of claim 27 wherein the cooling rate is less than about 20° C./second.

29. The process of claim 27 wherein the cooling rate is less than about 10° C./second.

30. The process of claim 27 wherein the cooling rate is less than about 5° C./second.

31. The process of claim 19 wherein the cooling rate is controlled between the maximum temperature achieved during the heat-treatment to a temperature of about 900° C.

32. The process of claim 31 wherein the cooling rate is less than about 20° C./second.

33. The process of claim 31 wherein the cooling rate is less than about 10° C./second.

34. The process of claim 31 wherein the cooling rate is less than about 5° C./second.

35. The process of claim 19 wherein the wafer is cooled in a nitriding atmosphere.

36. The process of claim 19 wherein the wafer is cooled in an oxidizing atmosphere.

37. The process of claim 19 wherein the wafer is cooled in a non-nitriding, non-oxidizing atmosphere.

38. A process for heat-treating a Czochralski single crystal silicon wafer to dissolve pre-existing oxygen clusters and to prevent future precipitate formation resulting from an oxygen precipitation heat treatment, the process comprising:

heat-treating the wafer at a temperature of at least about 1150° C. in a rapid thermal annealer to dissolve pre-existing oxygen clusters;

cooling the heat-treated wafer to a temperature between about 950 and 1150° C. at a rate in excess of about 20° C.;

thermally annealing the cooled wafer at a temperature between about 950 and 1150° C. for a time period sufficient to reduce the number density of crystal lattice vacancies in the cooled wafer prior to cooling the wafer below a temperature of about 950° C., to produce a wafer which is incapable of forming oxygen precipitates upon being subjected to an oxygen precipitation heat treatment.

39. The process of claim 38 wherein the cooled wafer is thermally annealed at a temperature of about 950° C. for about 2 minutes.

40. The process of claim 38 wherein the cooled wafer is thermally annealed at a temperature of about 950° C. for about 6 minutes.

41. The process of claim 38 wherein the cooled wafer is thermally annealed at a temperature of about 1150° C. for about 2 seconds.

42. The process of claim 38 wherein the cooled wafer is thermally annealed at a temperature of about 1150° C. for about 6 seconds.

43. The process of claim 38 wherein the wafer is heat-treated at a temperature of at least about 1175° C.

44. The process of claim 38 wherein the wafer is heat-treated at a temperature between about 1200 and about 1275° C.

* * * * *